United States Patent [19]

Suzuki et al.

[11] Patent Number: 5,001,487

[45] Date of Patent: Mar. 19, 1991

[54] SEMICONDUCTOR INTEGRATED CIRCUIT DEVICE

[75] Inventors: Yasunaga Suzuki; Toshiaki Matsubara; Haruo Mamyoda; Akira Uragami, all of Takasaki, Japan

[73] Assignee: Hitachi, Ltd., Tokyo, Japan

[21] Appl. No.: 544,063

[22] Filed: Jun. 26, 1990

Related U.S. Application Data

[63] Continuation of Ser. No. 456,192, Dec. 19, 1989, abandoned.

[30] Foreign Application Priority Data

Jan. 25, 1985 [JP] Japan ................................. 60-10832
May 17, 1985 [JP] Japan ................................. 60-103727

[51] Int. Cl.$^5$ .................. H01L 27/04; H01L 27/082; H01L 27/102
[52] U.S. Cl. ........................................ 357/43; 357/45
[58] Field of Search ..................... 357/45, 43; 307/415

[56] References Cited

U.S. PATENT DOCUMENTS 4,414,547 11/1983 Knapp et al. ................... 307/465 X
4,442,508 4/1984 Knapp et al. ................... 307/465 X
4,556,947 12/1985 Prioste et al. ................... 307/465 X
4,593,205 6/1986 Bass et al. ........................ 357/45 X
4,617,479 10/1986 Hartmann et al. ................. 307/465

FOREIGN PATENT DOCUMENTS 0125504 4/1984 European Pat. Off.
2137413 3/1984 United Kingdom.

OTHER PUBLICATIONS

Lopez et al., "A Dense Gate Matrix Layout Method for MOS VLSI", IEEE Journal of Solid State Circuits, vol. SC-15, No. 4, Aug. 1980, pp. 736-740.
Electronics and Communications in Japan, vol. 66, No. 1, Jan. 1983, pp. 111-119.

Primary Examiner—Thomas H. Tarcza
Assistant Examiner—John B. Sotomayor
Attorney, Agent, or Firm—Antonelli, Terry, Stout & Kraus

[57] ABSTRACT

A semiconductor integrated circuit device is disclosed. The circuit device uses modified (m+n) input cells, each equipped with high load driving functional elements disposed at the periphery of the cell, and having n signal input terminal(s) in addition to m normal signal input terminals that are incorporated in the cell.

5 Claims, 12 Drawing Sheets

SEMICONDUCTOR INTEGRATED CIRCUIT DEVICE

This application is a continuation of application Ser. No. 456,192, filed on Dec. 19, 1989, which is a continuation of application Ser. No. 822,786, filed on Jan. 27, 1986, now abandoned.

BACKGROUND OF THE INVENTION

This invention relates generally to a semiconductor integrated circuit device (IC), and more particularly to a technique suitable for use in gate arrays as a type of semi-custom IC.

A gate array includes, for example, an input-output buffer portion and an internal circuit portion, with a plurality of unit cells (macrocells) formed inside the internal circuit portion. Each of the unit cells (macrocells) in turn consists of a plurality of gates.

The gate array makes it possible to produce a wide variety of semiconductor integrated circuit devices by applying respective wirings in accordance with the types of the semiconductor integrated circuit devices to large quantities of master wafers that are produced in advance. The gate array provides other advantages such as the reduction of cost of production due to the mass-production of the master wafers, the automatic design of the wirings, and the reduction of the development period by a production process which requires only wiring.

The term "gate" hereby means a minimum unit constituting a logic circuit (a logical functional block that cannot be divided any more), and the term "unit cell (macrocell)" means a logical functional block constituted by a plurality of gates, such as a multiplexor, a flip-flop, and the like.

The disposition of each cell and the disposition of wirings in the gate array are made by use of CAD (Computer Aided Design) or DA (Design Automation).

Hitachi, Ltd. previously developed a Bi-CMOS gate array of a type in which bipolar elements and CMOS-FET (complementary insulated gate field effect transistor) exist inside one chip. This previous arrangement is described in Japanese Patent Application No. 152886/1984. The present invention pertains primarily to improve the integration density of the Bi-CMOS gate array described above and to a layout technique which can enhance the cell utilization efficiency of the gate array.

In order to improve the integration density of the gate array, the following requirements must be satisfied.

(1) A greater number of basic cells (which will be later described) must be formed inside a limited semiconductor substrate.

(2) All the basic cells must be used efficiently.

In the Bi-CMOS composite gate array described above, however, it has been difficult to satisfy the requirements (1) and (2) described above because the area of one basic cell tends to be greater than that of a pure CMOS cell, and to secure wiring regions.

SUMMARY OF THE INVENTION

It is an object of the present invention to provide a novel semiconductor integrated circuit device which has excellent performance in terms of high speed operation, low power consumption and high integration density.

The following are typical examples of the present invention.

1. A large number of basic cells are regularly arranged inside one semiconductor substrate in a predetermined direction such as in an X direction, and one basic cell includes an element having a high load driving capacity (e.g., a bi-polar transistor) and elements having low power consumption (e.g., CMIS FETs).

The element having a high load driving capacity is disposed in the peripheral portion of the basic cell, and a power source wiring arranged in a direction in which the basic cells are arranged (that is, in the X direction) can be connected to the high load driving element. The low power consumption element is disposed at the center of the basic cell, and an internal wiring of the basic cell array extended in the X direction or in a Y direction vertical to the X direction and consisting of the same layer as that of the power source wiring can be connected to the low power consumption element.

According to the arrangement described above, the power source wiring extends in the peripheral portion of the basic cell and does not create any problem when the internal wiring of the basic cell array is extended. Therefore, the wiring structure can be simplified and a higher integration density for the IC can be accomplished.

2. A plurality of basic cell arrays, each consisting in turn of a plurality of basic cells arranged in the X direction, are arranged with predetermined gaps between them in the Y direction, and constitute a basic cell matrix. The wirings used for connecting the basic cells with one another are the following two kinds. The first is internal wirings (first wirings) inside the basic cell array and the second is external wirings (second wirings) that are extended outside the basic cell arrays or in the predetermined gaps between the basic cell arrays described above. Both internal and external wirings provide electrical connections among selected circuit elements (including signal input terminals) of basic cells to form a gate(s) and/or unit cell(s). Each basic cell has a first signal input termianls that can be connected to the external wirings as well as n second signal input terminals that can be connected only to the internal wiring of the basic cell array. With this arrangement, each basic cell includes enough circuit elements (such as diffusion layers and resistor layers) to constitute a basic circuit that can receive substantially a maximum m+n number of signal inputs. Instead of disposing m+n terminals that can be connected to the external wirings, each basic cell has built-in n second signal input terminals and effectively uses them besides the m first signal input terminals in order to simplify the layout arrangement of the wirings and the wiring structure and to improve the integration density and the cell utilization efficiency.

BRIEF DESCRIPTION OF THE DRAWINGS

FIG. 3 is a circuit diagram showing a definite construction of a block 211 shown in FIG. 2; wherein

FIG. 4 shows a definite construction of a block 213 shown in FIG. 2; wherein

FIGS. 9, 10 and 11 are explanatory views showing the characterizing features of the present invention; wherein

FIGS. 11(a), 11(b) and 11(c) are explanatory views useful for explaining the features and problems when the 3-input NAND type cell is used; wherein

DESCRIPTION OF THE PREFERRED EMBODIMENTS a) Problems examined by the inventors before the present invention The following items are important in order to improve the integration density.

(1) To assemble the greatest possible number of basic cells (basic unit on a layout which contains circuit elements sufficient to constitute one gate, such as a transistor, a resistor, or the like) in one semiconductor substrate. To accomplish this object, an occupying area of one basic cell must be minimized. A gate array is an IC in which a large number of (e.g., from several thousands to tens of thousands) of basic cells (which will be sometimes referred to also as "cells") are arranged, and even if the difference of the occupying area of one basic cell is very small, this small difference is build up when a large number of basic cells are integrated so that the integration density will be remarkably different eventually.

(2) The basic cells formed in the substrate must be utilized effectively. Even if a large number of basic cells are formed in the semiconductor substrate, there is no technical significance if such basic cells can not be utilized for forming a practical circuit. The cell utilization efficiency primarily depends upon where wirings that can be connected to each of a large number of cells can be actually extended in a limited layout space. Therefore, unless the wirings can be extended, the cells cannot be utilized but are left in vain. It is of course possible to improve the utilization ratio of the cells by securing a sufficient space for extending the wirings, but the integration density will drop correspondingly.

(3) A logic circuit, that can be constituted by the use of the elements (transistor, etc.) incorporated in one cell, must be selected carefully.

For instance, although a 2-input NAND circuit and a 3-input NAND circuit can be formed respectively by use of one basic cell, various differences occur between them when designing a gate array. In other words, since the number of inputs of the 3-input NAND type cell is greater by one than that of the 2-input NAND type cell, the occupying area of the former becomes correspondingly greater. However, if all the circuits requested by users in general can be constituted basically by the 3-input NAND type, the cell utilization efficiency can of course be improved by use of the 3-input NAND type cells. On the contrary, if the circuits requested by the users can be constituted primarily by use of the 2-input type cells, the integration density can be more improved by use of the 2-input NAND type cells.

Figure 14:
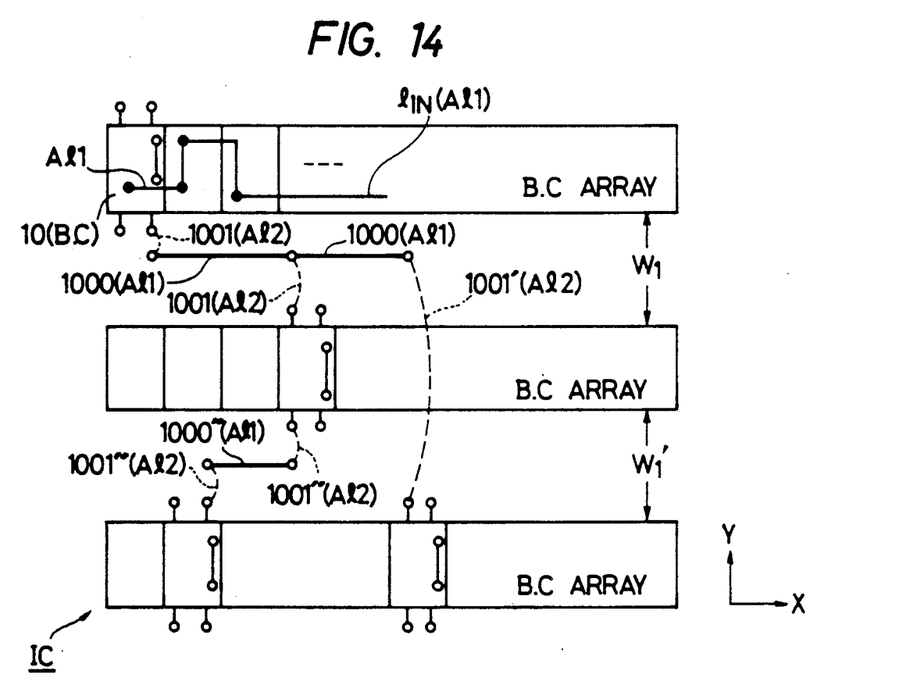
FIG. 14 is a planar layout diagram useful for explaining the wiring rule in the gate array in the present invention.

Thus, each type of cell has its merit and demerit. The circuits actually requested by the users are diversified; some consisting basically of the 3-input NAND circiuts while the other consisting basically of the 2-input NAND circuits. Therefore, the selection of the cell types must be made carefully by examining the merit and demerit of each type and comparing them with those of the other types and at times, empirically.

b) Wiring rule in gate array:

A wiring rule will be explained with reference to FIG. 14. As shown in the drawing, basic cell arrays (B.C) 10 are arranged in an X direction to form a basic cell array, and the basic cell arrays are arranged in a Y direction to constitute a basic cell matrix as a whole.

Spaces ($W_1$, $W'_1$) between these B.C arrays are extension regions of external wirings, and the external wirings (1000, 1000') in the X direction and external wirings (1001, 1001', 1001") in the Y direction are extended in these regions.

Internal wirings $l_{IN}$ inside the B.C array are disposed in both X and Y directions inside each B.C array in order to electrically connect each basic cell.

As shown in the drawing, the internal wiring $l_{IN}$ and the external wiring (1000, 1000') in the X direction consist of an aluminum first layer wiring (Al1), and the external wiring (1001, 1001', 1001") in the Y direction consists of an aluminum second layer wiring (Al2).

c) Features of the present invention:

In order to have the present invention more easily understood, the features of the present invention will be explained with reference to FIGS. 9 through 12 before the definite description of the embodiments.

Figures 9A, 9B, 9C, 9D, 9E:
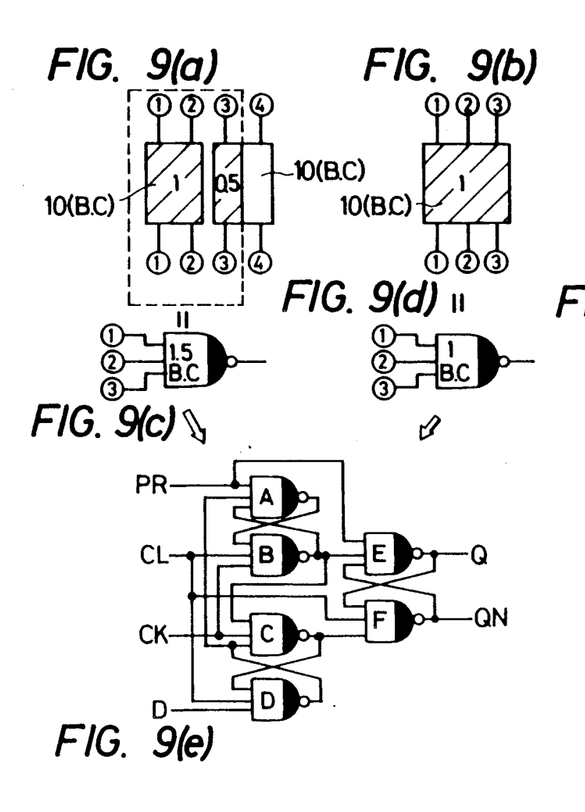
FIG. 9(a) is a plan view showing in a symbolized form a 2-input NAND basic cell.
FIG. 9(b) is a plan view showing in a symbolized form a 3-input NAND basic cell.
FIG. 9(c) shows logic symbols of the 2-input NAND unit cell.
FIG. 9(d) shows logic symbols of the 3-input NAND unit cell.
FIG. 9(e) is a circuit diagram of a D-type flip-flop using the 3-input NAND circuit.

First of all, it will be assumed that a D-type flip-flop circuit such as shown in FIG. 9(e) is constituted by 3-input NAND type cells. If the 3-input NAND type cells shown in FIGS. 9(b) and 9(d) are used, the flip-flop circuit described above can be constituted by six basic cells. If 2-input NAND cells such as shown in FIGS. 9(a) and 9(c) are used, however, nine basic cells ($1.5 \times 6 = 9$) are necessary to obtain the flip-flop circuit. Therefore, if the 3-input NAND cells are used, the number of cells used is ⅔ of those used with 2-input NAND cells, and this is more efficient.

Figures 10A, 10B, 10C, 10D, 10E, 10F, 10G, 10H:
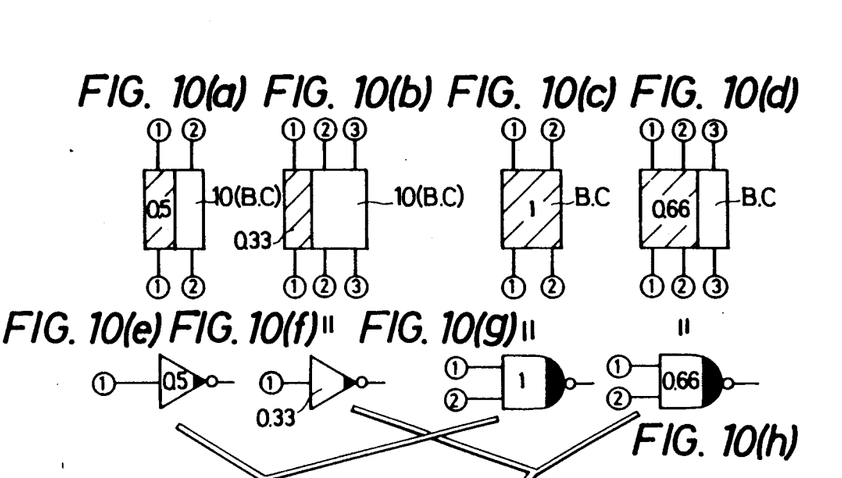
FIGS. 10(a) through 10(d) are symbol diagrams useful for explaining the utilization efficiency of the 2-input NAND type cell and the 3-input NAND type cell.
FIGS. 10(e) through 10(h) are logic symbol diagrams corresponding to FIGS. 10(a) through 10(d), respectively.
Figure 10I:
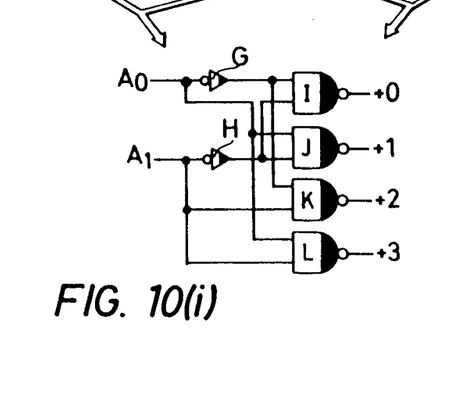
FIG. 10(i) is a circuit diagram of a 2-bit decoder constituted by using the 2-input NAND circuit and an inverter.

Next, it will be assumed that a 2-bit decoder is constituted by use of 2-input NAND cells and inverters as shown in FIG. 10(i). This 2-bit decoder consists of six circuit elements G through L and in this case, one basic cells is used to constitute one circuit element.

The utilization efficiency of the cell when the 2-input NAND cell is used will be explained with reference to FIGS. 10(a) and 10(c). It is only the five basic cells ($0.5 \times 2 + 1 \times 4$) that are effectively used for the 2-bit decoder in practice. In contrast, the cell utilization efficiency when the 3-input NAND cells are used will be explained with reference to FIGS. 10(b) and 10(d). In this case, 3.3 basic cells ($0.33 \times 2 + 0.66 \times 4 = 3.3$) are utilized effi- ciency. In other words, the utilization efficiency is 5/6 for the 2-input NAND cell whereas it is 3.3/6 for the 3-input NAND cell, and the former is higher than the latter. Thus, the merit and demerit of the basic cell vary depending upon the circuit (unit cell) to be fabricated.

One of the characterizing features of the present invention lies in that the cell types to be used can be changed suitably in accordance with the circuit construction of the circuit (unit cell) to be fabricated in consideration of the merit and demerit of each cell type, and can form a desired gate array most efficiently.

This feature of the present invention will be explained with reference to FIGS. 10 and 11.

Figure 11A:
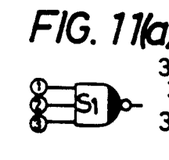
FIG. 11(a) is a logic symbol diagram of a 3-input NAND cell.
Figure 11B:
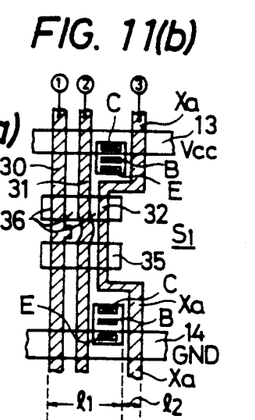
FIG. 11(b) is a layout diagram.
Figure 11C:
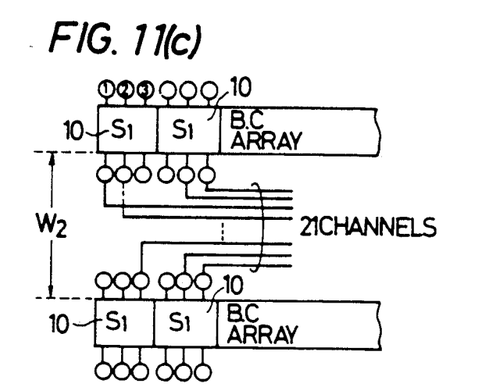
FIG. 11(c) is a layout diagram showing the wiring state between basis cell arrays.
Figure 11D:
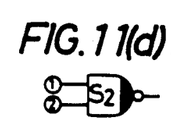
FIGS. 11(d) through 11(f) show the features when the 2-input NAND type cell is used, and correspond to FIGS. 11(a) through 11(c), respectively.
Figure 11E:
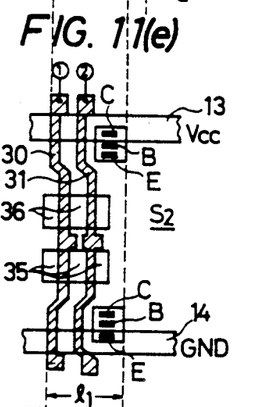
Figure 11F:
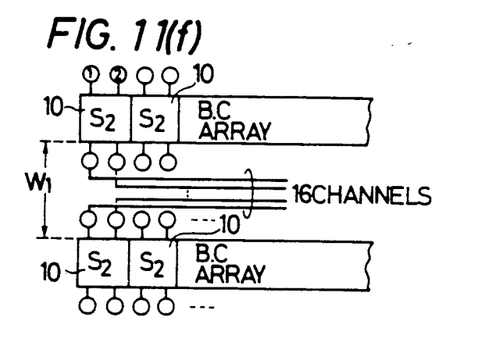
Figure 11G:
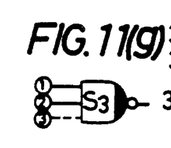
FIGS. 11(g) through 11(i) show the feature when a modified 2-input cell of the present invention is used and correspond to FIGS. 11(a) through 11(c), respectively.
Figure 11H:
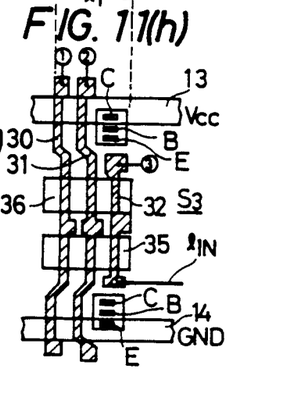
Figure 11I:
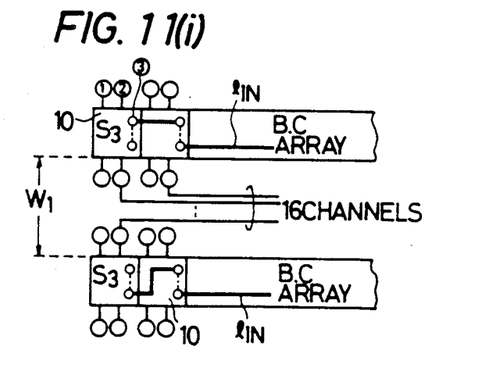

FIGS. 11(a) through 11(c) illustrate the feature of the present invention when the 3-input NAND type cells are used, wherein (a) is a logic symbol diagram, (b) is its definite layout diagram and (c) shows the channel number of external wirings extended between the cell arrays. FIGS. 11(d) through 11(f) shows the feature of the invention when the 2-input NAND cells are used, and correspond to FIGS. 11(a) through 11(c), respectively. FIGS. 11(g) through 11(i) show the feature of the invention when modified 2-input cells in accordance with the present invention are used, and correspond to FIGS. 11(a) through 11(c), respectively.

First of all, the occupying area of one cell will be compared with reference to FIGS. 11(b), (e) and (h). The explanation of the definite construction will be hereby omitted because it will be described elsewhere. In the drawings, the portions represented by oblique lines designate the gate of each MOSFET formed by polysilicon, and each functions as a signal input terminal. As can be seen from FIG. 11(a), the lateral width of the cell increases by the width of a third signal input terminal Xa in the case of the 3-input NAND cell, and the overall lateral width amounts to $l_1 + l_2$. In order to effectively utilize the three signal input terminals as shown in FIG. 11(c), 21 external wirings are necessary therefor.

In the case of the 2-input NAND cell, on the other hand, the lateral width may be only $l_1$ as shown in FIG. 11(e). Since the number of the signal input terminals of each cell decreases as can be seen from FIG. 11(g), the total number of the necessary external wirings may be only 16, so that the width between the B.C array is $W_1$ and this is considerably smaller than $W_2$ in FIG. 11(c).

The modified 2-input cell is based upon the 2-input NAND cell described above, and its occupying area as well as its wiring channel number are the same as those of the latter. The difference lies in that the modified 2-input cell has a built-in third signal input terminal, and the cell can be used as the 3-input NAND cell, whenever necessary, by utilizing this terminal.

This third terminal is not connected to the the external wiring, but the internal wiring $l_{IN}$ of the basic cell array can be connected to it.

Figures 12, 13:
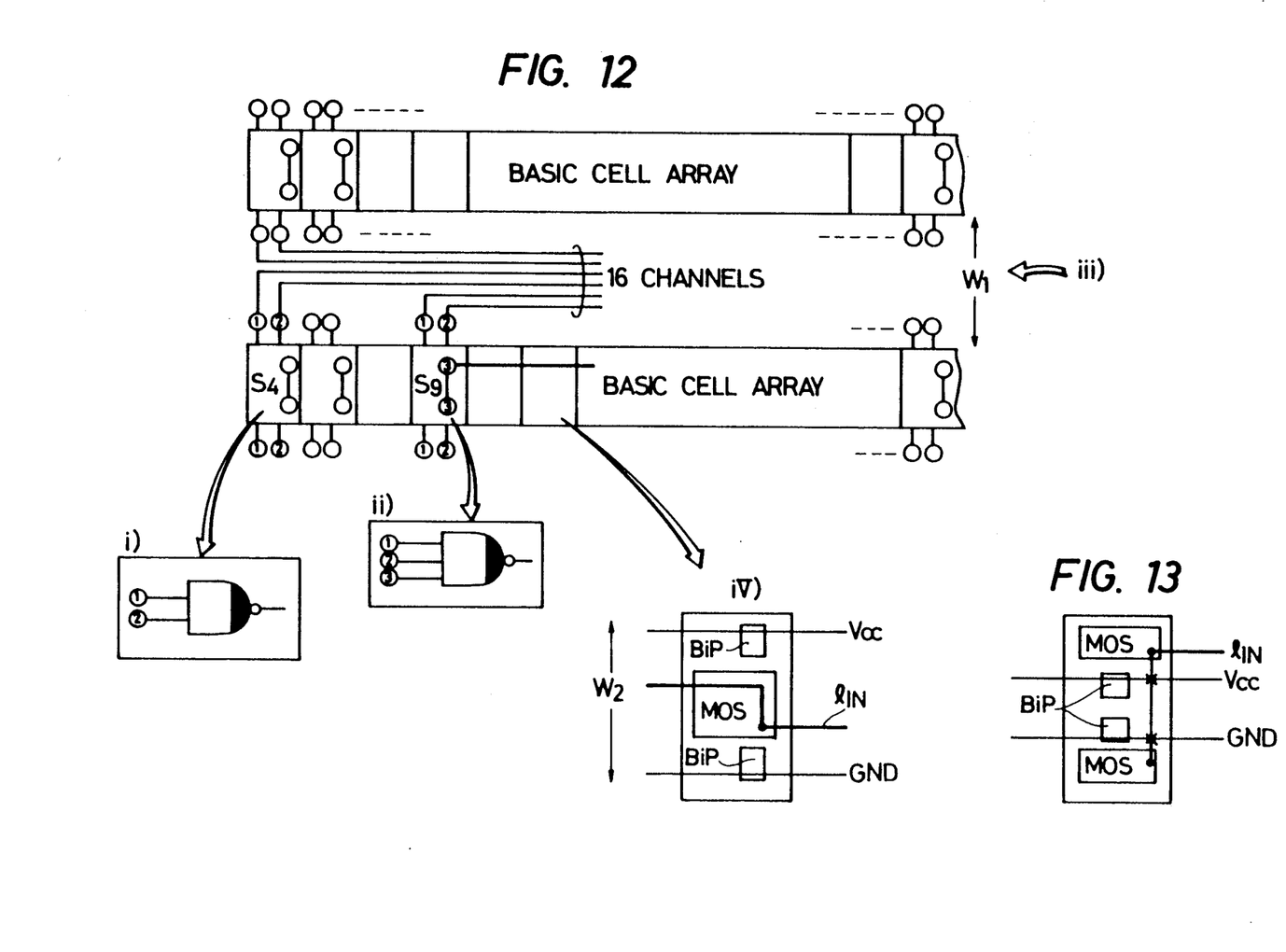
FIG. 12 is a plan view of a gate array showing the four features (i) through (iv) of the present invention.
FIG. 13 is a layout diagram of a basic cell and is useful for explaining the problem when the present invention is not used.

Another characterizing feature of the present invention lies in the layout of the modified 2-input cell. As shown in FIG. 12(iv), bipolar transistors as high load driving functional elements are disposed on both sides of a cell in one cell, while an MOS element is disposed at the center of the cell. According to this layout, a $V_{cc}$ line and a ground line (GND) extend along both edges of the cell and do not create a problem to the extension of the internal wiring $l_{IN}$. If the bipolar elements are disposed at the center of the cell with the MOS elements at both ends of the cell as shown in FIG. 13, the $V_{cc}$ line and the GND line must extend through the center of the cell so that the extension of the internal wiring $l_{IN}$ is prevented.

The features of the invention described above can be summarized as follows with reference to FIG. 12.

(i) The cell normally operates as the 2-input NAND cell.

(ii) It can be used as the 3-input NAND cell, whenever necessary.

(iii) The external wirings may be the same as those of the 2-input NAND cell, and hence the gap $W_1$ between the basic cell arrays can be reduced.

(iv) The wiring structure can be simplified because the bipolar elements are disposed at the external portions and the MOS element, at the inner portion.

(d) Embodiments of the invention:

Hereinafter, the definite content of the invention will be explained with reference to the drawings.

Figure 1:
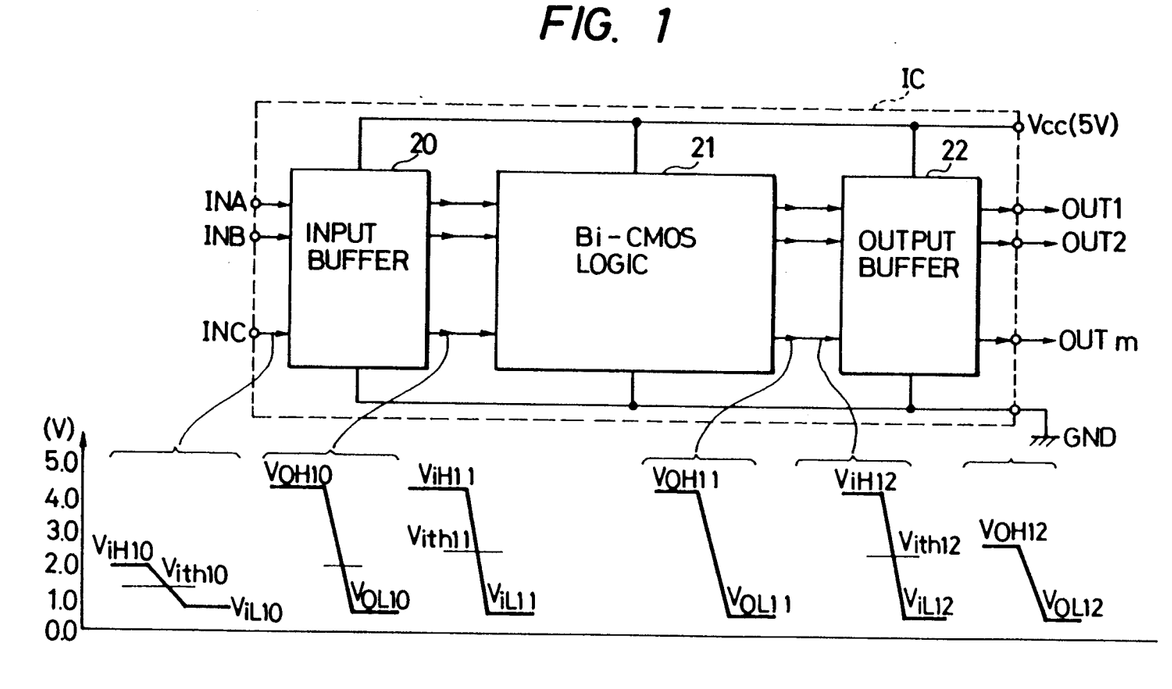
FIG. 1 shows the overall system configuration of a gate array and logic levels of signals in respective blocks.

FIG. 1 shows the overall system configuration of the gate array (IC) of the present invention and signal levels at respective portions of the gate array. As can be seen from the drawing, this IC consists of an input buffer 20, a logic portion 21 consisting principally of CMOS and an output buffer 22. The input buffer 20 has a level converting function (and if necessary, a logic calculation function). For example, it converts input signals $IN_A$, $IN_B$ and $IN_C$ of a TTL level received from outside to signals of a CMOS levels, and its output signal is applied to the logic portion 21 consisting principally of CMOS. On the other hand, the output buffer 22 has a level converting function of converting the signals of the CMOS level to signals of the TTL level, for example. (If necessary, a logic calculation function can be further added.) Eventually, it produces the output signals $OUT_1$, $OUT_2$, ..., $OUT_m$ of the TTL level, for example.

Figure 2:
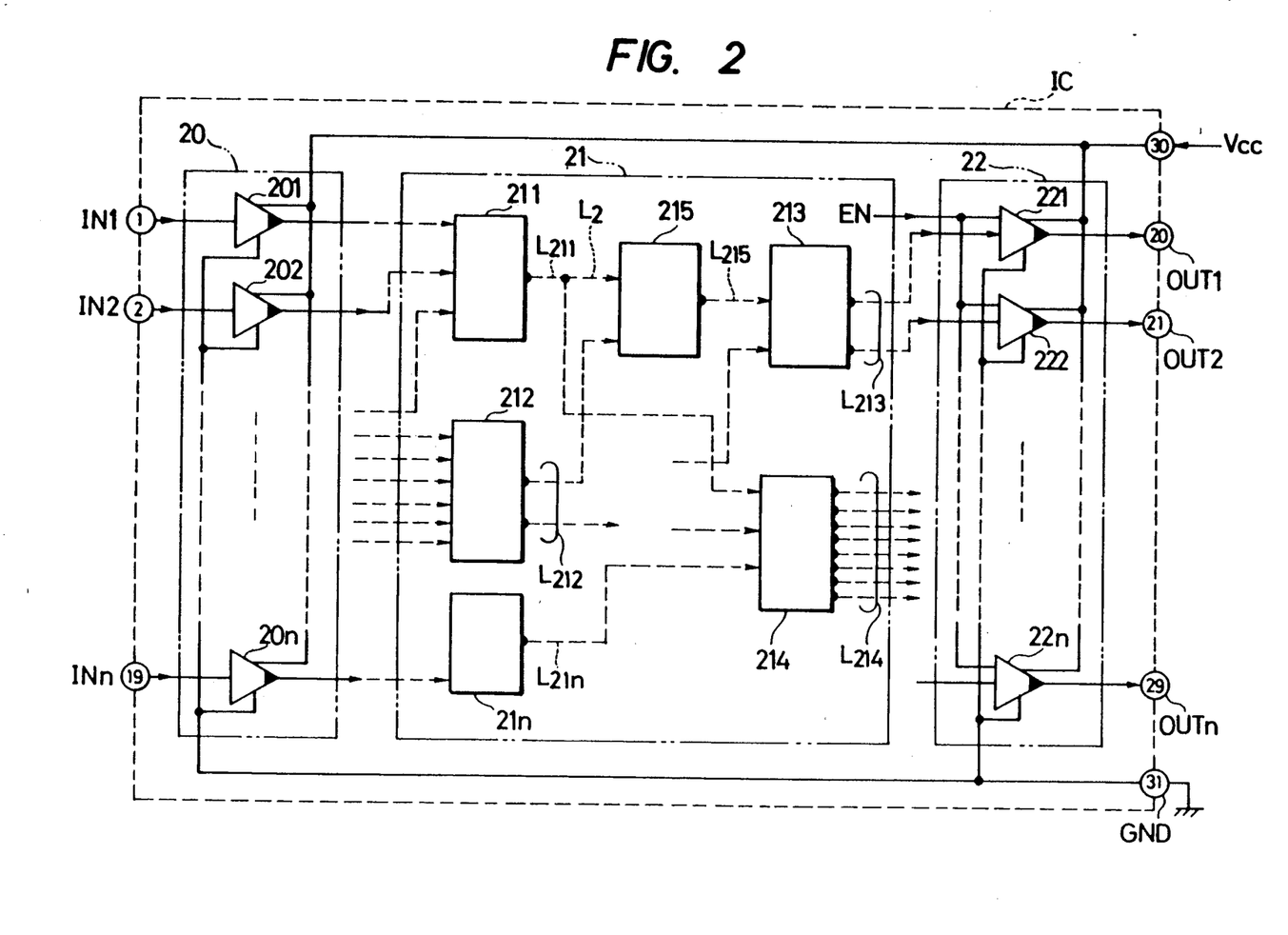
FIG. 2 is a circuit diagram and shows a further definite circuit construction of a macrocell level of a gate array shown in FIG. 1.

FIG. 2 shows in further detail the internal construction of the system shown in FIG. 1. In the drawing, reference numerals 21l–21n in the logic portion 21 represent unit cells (macrocells) and black circles or the tip portions colored in black represent that the circuit of the output stage is constituted by a bipolar circuit. (The rest of the portions are constituted by CMOSs of low power consumption type.) The term "unit cell (macrocell)" means a logic function block constituted by a plurality of logic elements (which are the minimum unit constituting a logic circuit and a logic function block which can not be divided any more), and represents, for example, a multiplexor or a flip-flop. The arrangement of each cell and the arrangement of wirings are made by use of DA (Design Automation).

As described already, the output gate (output buffer) of each of the unit cells 21l–21n, the input buffers 20l–20n and the output buffers 22l–22m is a high load driving type gate consisting of a bipolar circuit. For this reason, a signal delay quantity can be made substantially equal to a small signal delay quantity of an internal gate irrespective of the length of wirings connecting one unit to another or the magnitude of the load, and the freedom of design can be remarkably improved.

Figure 3A:
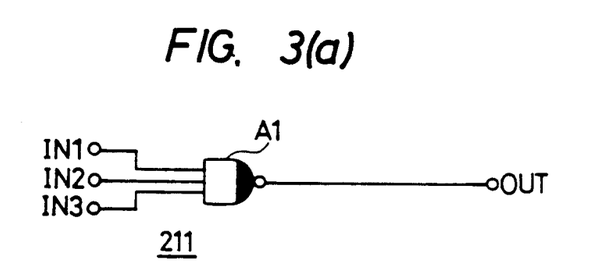
FIG. 3(A) shows logic symbols.
Figure 3B:
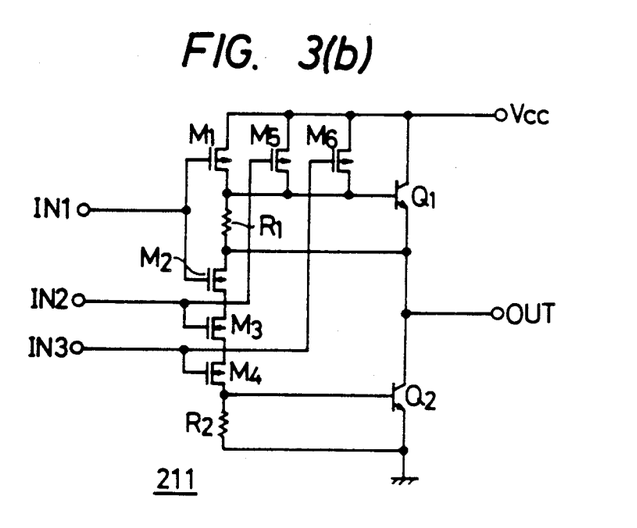
FIG. 3(B) shows a definite circuit construction.

The block 211 shown in FIG. 2 has a construction shown in FIGS. 3(A) and 3(B), wherein (A) shows logic symbols and (B) does a definite circuit construction.

Figure 4A:
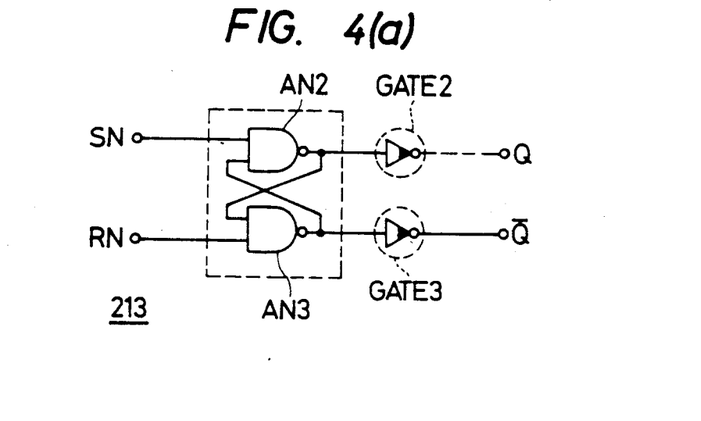
FIG. 4(a) is a circuit diagram showing an example of a unit cell (macrocell) by use of logic symbols of an R-S flip-flop.
Figure 4B:
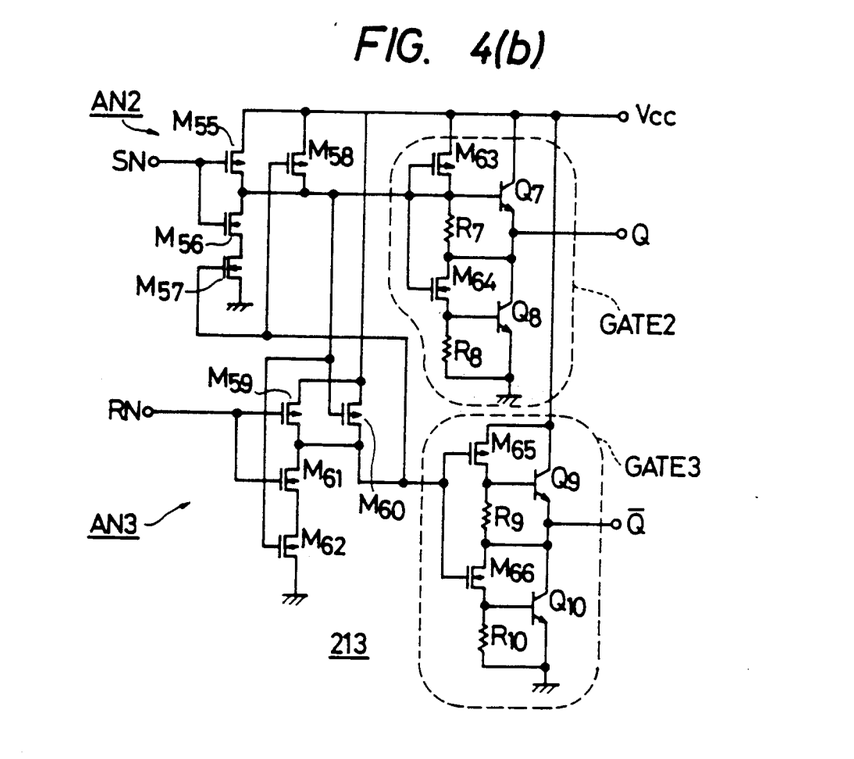
FIG. 4(b) is a definite circuit diagram of the R-S flip-flop circuit shown in FIG. 4(a)

In FIG. 2, the block 213 is, for example, an R-S flip flop circuit constituted such as shown in FIGS. 4(a) and 4(b).

Figure 5A:
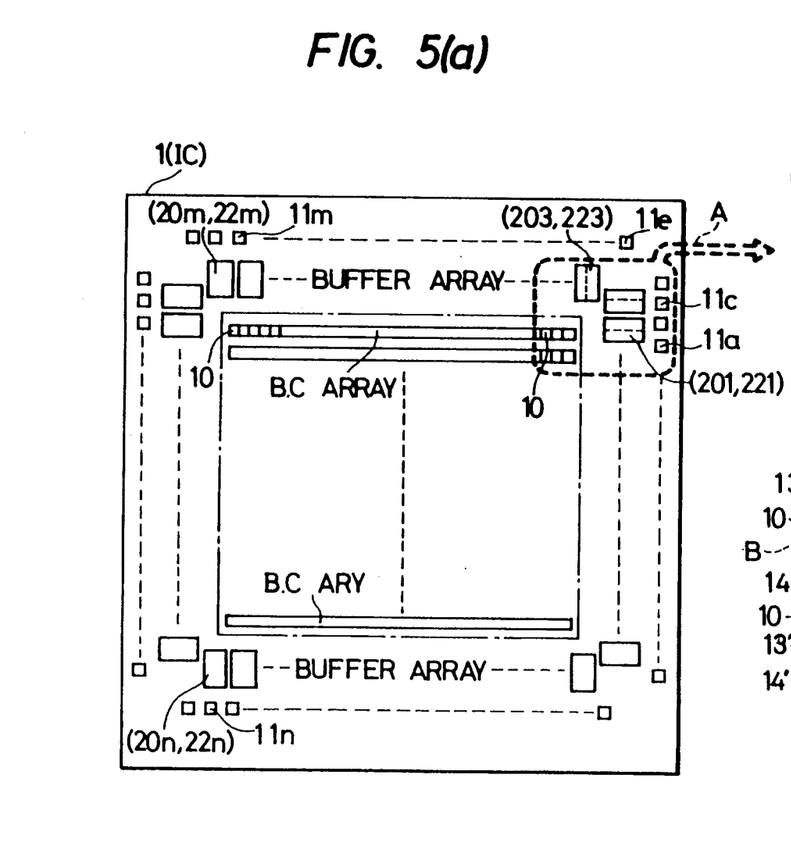
FIG. 5(a) shows an overall planar layout of a gate array.

Next, the planar layout of the silicon chip 1 of the IC (gate array) shown in FIGS. 1 and 2 will be explained with reference to FIGS. 5(a) and 5(b). As shown in FIG. 5(a), the arrays of the Bi-CMOS cells (basic cells) 10 are arranged regularly in the chip, and the input-output buffers 20, 22 are arranged around the arrays. Bonding pads are disposed around the outermost periphery.

Figure 5B:
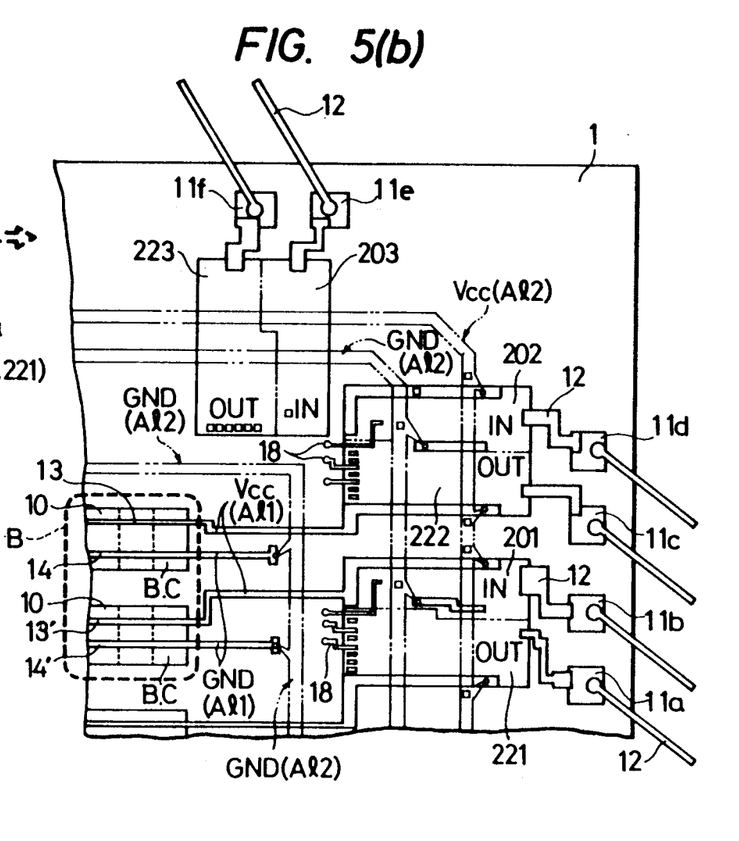
FIG. 5(b) shows in more detail the layout of an A region shown in FIG. 5(a)

FIG. 5(b) is a planar layout diagram showing more definitely the layout structure of the portion A encompassed by dotted line in FIG. 5(a). Bonding wires 12 are connected to pads 11, and the pads and input-output buffers (20n, 22n) are connected by first layer Al wirings 12. A power source ($V_{cc}$) line and a ground (GND) line of a second layer Al wiring are extended on the input-output buffers (20n, 22n), and are connected to the first layer Al wiring through respective throughholes. Thus, the $V_{cc}$ line 13 and the GND line 14 that are common to the input-output buffers and the basic cell arrays are extended.

The above explains the overall construction of the IC.

Next, the important features of the present invention will be explained once again.

Figure 6A:
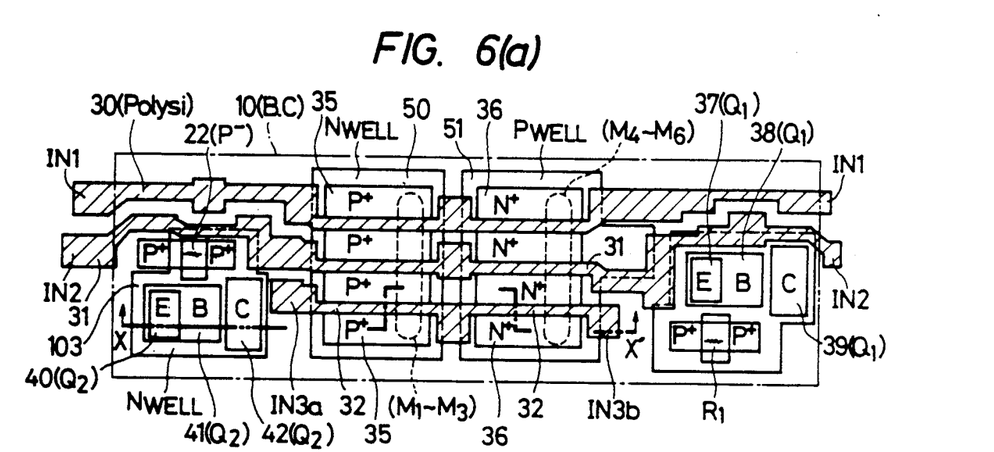
FIG. 6(a) is a planar layout diagram showing primarily the arrangement of diffusion layers and polysilicon layers in one unit cell.
Figure 6B:
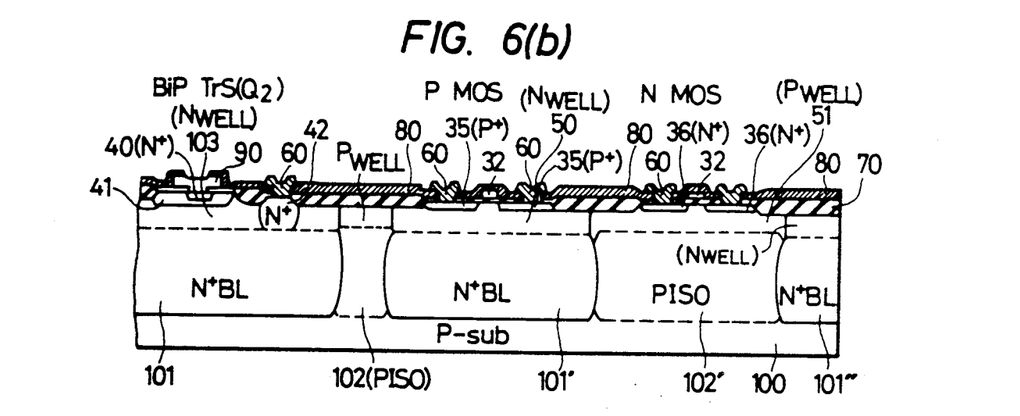
FIG. 6(b) is a sectional view of the device taken along line X—X of a basic cell shown in FIG. 6(a)
Figure 6C:
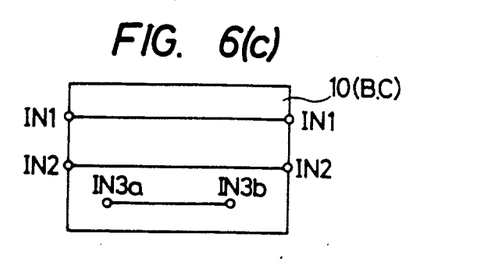
FIG. 6(c) is a diagram showing the input terminal arrangement of the basic cell shown in FIG. 6(a)
Figure 7A:
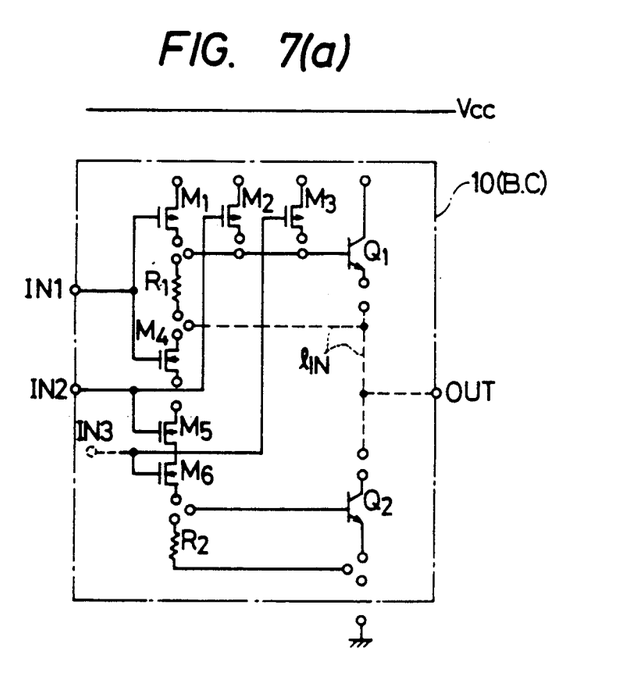
FIG. 7(a) is a circuit diagram showing the construction of a basic cell.
Figure 7B:
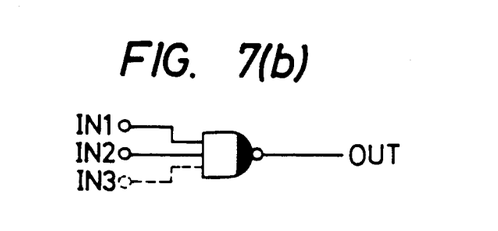
FIG. 7(b) is a diagram showing the construction of the basic cell by logic symbols.
Figure 8:
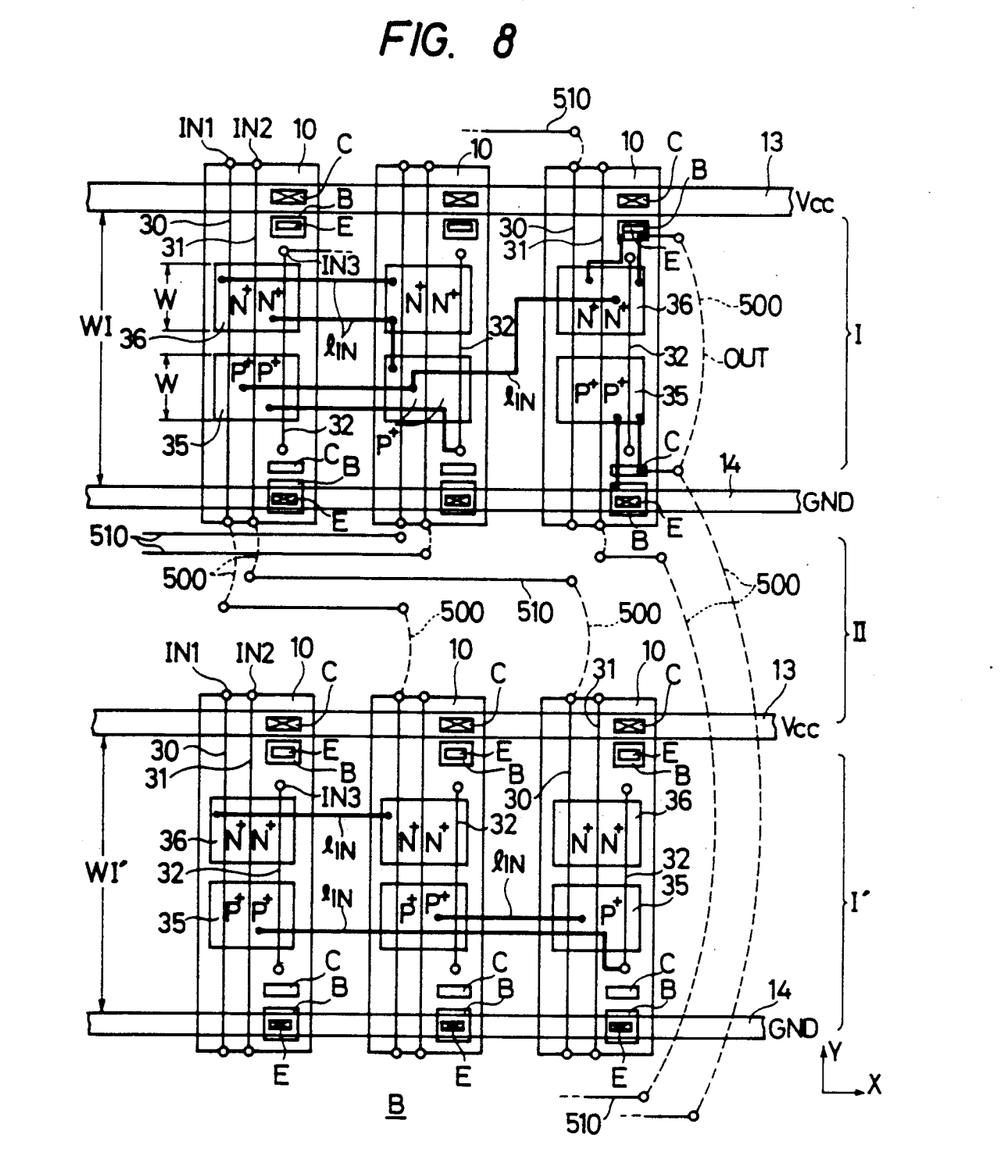
FIG. 8 is a planar layout diagram showing the inside of a basic cell and the wiring state between the basic cells and between basic cell arrays in accordance with one embodiment of the present invention.

FIG. 8 shows definitely the planar layout of the region B encompassed by dotted line in FIG. 5(b) and FIG. 6(a) shows the planar layout of the basic cells (sometimes referred to as "B.C") shown in FIGS. 5(a) and 5(b) with the diffusion layer in the chip being shown primarily. FIG. 6(b) is a sectional view taken along X - X" in FIG. 6(a). FIG. 6(c) is a diagram showing the input terminal arrangement of the basic cell shown in FIG. 6(a) relative to the boundaries of the basic cell. In particular, as shown in FIGS. 6(a) and 6(c), each basic cell has m+n signal input terminals, where m is the number of terminals such as IN1 and IN2 which extend to the boundary of the basic cell to be coupled to the external wirings (e.g. see the coupling of external wirings 500 and 510 in FIG. 8), and where n is the number of terminals such as IN3a–3b which are inside the basic cell for connection to the internal wirings $l_{IN}$ (see FIG. 8). FIG. 7(a) shows the circuit of the basic cell and FIG. 7(b) shows the basic cell as logic symbols.

The term "basic cell" means a basic unit of the layout constuction at the logic portion formed by disposing constituent elements necessary for constituting an electronic circuit in a predetermined pattern.

The layout structure of the basic cell 10 will be explained with reference to FIGS. 6(a) and 6(b). As shown in the drawings, the basic cell 10 is formed of the polysilicon gate electrodes 30,31, 32, n-well 50 and p-well 51, a p+ diffusion layer 35 as the source-drain of a P-MOSFET, an N+ diffusion layer 36 as the source-drain of an N-MOSFET, diffusion layers 37, 40 (serving as emitter: E) constituting two bipolar NPN transistors $Q_1$, $Q_2$, diffusion layers 38, 41 (as base: B), diffusion layers 39, 42 (as collector: C), and two impedance elements, that are, in this case, resistors $R_1$, $R_2$.

As noted above, 6(b) is a sectional view of the basic cell 10 shown in FIG. 6(a) taken along line X - X'. This structure can be manufactured using various known semiconductor manufacturing processes. For example, the P-type isolation regins 102 and 102' can be formed in the substrate 100 by diffusion of boron into the substrate, while the N+-type buried layer regions 101, 101' and 101" can be formed by diffusion of antimony into the substrate. Diffusion of these dopants at 1200° C. for 40 minutes, for example, can be used for initially forming these regions. Subsequently, an N− epitaxial layer can be formed over the substrate to cover the regions 101, 102, etc. by a conventional epitaxial deposition step (e.g. 970° C. for 10 minutes could be used). Next, N-type well regions 50 and 103 and P-type well 51 can be formed in the epitaxial region by ion implantation of phosphorus and boron, respectively. As an example, P-ion implantation can be carried out at 125 KeV with a dosage of $3 \times 10^{11}$ atoms/cm² using a $Si_3N_4$ mask followed by boron ion implantation at 60 KeV and a dosage of $4.0 \times 10^{13}$ atoms/cm² using a $SiO_2$ film mask (e.g. the Locos technique). The ion implantation step can then be followed by a diffusion step (e.g. 1000° C. × 300 minutes) to cause expansion of the respective regions 101, 102, etc. and the wells 50, 51 and 103 into one another to provide the structure shown in FIG. 6(b). Following this, the respective MOS and bipolar transistors can be formed in openings in the $SiO_2$ layer 70 using conventional transistor forming techniques. Finally, a PSG (phospho-silicate glass) film 80 can be deposited (e.g. at 480° C. for 10 minutes) over the device for protection.

A plurality of basic cells 10 can be formed in a surface of a semiconductor substrate to constitute a basic cell array in an X direction. Also, basic cell arrays may be obtained by forming a plurality of cell arrays in a Y direction.

FIG. 7 shows the circuit of the basic cell 10. As can be seen from this circuit diagram, a NAND gate which is apparently of a 2-input type but is substantially of a 3-input type can be constituted by applying predetermined wirings to the elements formed inside the basic cell 10. FIG. 7(b) shows the basic cell 10 in the symbolized form. Although FIG. 7(a) shows that two bipolar transistors are employed, one bipolar transistor may be used as an emitter follower configuration when only pushing a circuit out from the gate is needed for outer circuits.

FIG. 8 shows the basic cell 10 after wiring.

The wiring rule will be explained once again with reference to FIG. 8. In the drawing, regions I, I' are those in which the basic cells 10 are arranged regularly in the X direction (horizontal to the sheet of the drawing), and will be hereinafter called the "basic cell array".

The wiring inside the basic cell array is made by the first layer aluminum wiring $l_{IN}$ in both X direction and Y direction (perpendicular to the X direction) as indicated by thick line in the drawing.

Also $V_{cc}$ and GND lines may be made by the first layer aluminum wiring.

The wiring between the basic cell arrays (or macrocell wiring) is made by use of the first layer aluminum wiring 510 in the X direction as shown in FIG. 8 and by use of the second layer aluminum wiring 500 (represented by dotted line in the drawing) in the Y direction. The wirings 500 and 510 are separated from each other by an insulating layer formed with silicon oxide, silicon nitride, polyimide or the like. In the drawings, the region II is a wiring region in which the first layer aluminum wiring in the X direction and the second layer aluminum wiring in the Y direction are extended.

It is noted, according to the invention, that gates and/or unit cells are formed by providing electrical connections of the first and second conductive layers among selected circuit elements as well as terminals (i.e. connection portions of signal input lines). A part of each signal input line constitutes a gate electrode of an insulated gate field effect transistor formed in basic cells forming basic cell arrays or a matrix. In other words, for example, a unit cell may be formed in the manner that a selected circuit element(s) (including terminals) of a basic cell(s) in a basic cell array(s) are connected to another selected circuit element(s) (including terminals) of another basic cell(s) in another basic cell array(s), or that circuit elements (including terminals) of basic cells formed in the same basic array are connected to one another.

Whether particular basic cells and particular circuit elements (including terminals) of those basic cells can be selected and connected for a gate or unit cell is determined by layout rules of wirings in accordance with a circuit to be incorporated in a semiconductor substrate.

The above explains the basic construction of the gate array.

Next, the effect of the present invention and the reason why such an effect can be obtained will be described.

As described already, the basic cell is actually a 2-input NAND gate, but it incorporates therein one more gate and hence functions substantially as a 3-input NAND gate.

The planar layout condition of the basic cell is shown in FIG. 2(a), and when such a modified 2-input construction is employed, the cell occupying area can be reduced for the folowing reasons.

Referring to FIGS. 11(b), (e) and (h), the cell area increases in the case of (b) because the gate is formed in such a manner as to extend rightward of the bipolar element (the portion represented by symbol Xa). Studies made by the present inventors reveal that while $l_1 = 32$ μm in the drawing, $l_1 + l_2$ becomes 40 μm. Therefore, if the modified 2-input cell is used, the cell area can be reduced by 20%.

According to the construction described above, the effective utilization efficiency of the cell can also be improved.

In other words, when one circuit (macrocell) is formed, the freedom of the wiring can be significantly improved and the number of gates can be reduced by use of the 3-input NAND type cell than by the use of the 2-input NAND type cell. Essentially, the reason for this is that the number of input terminals of the former is greater than that of the latter so that the freedom of wiring can be improved. From the aspect of the cell utilization efficiency, however, the wiring channel number becomes greater in the case of the 3-input NAND, and when various macrocells are formed, the extension of the Al wirings becomes a critical problem in that the number of waste cells becomes greater and the chip area increases.

The modified 2-input cell described above becomes substantially a 3-input NAND type cell when the second signal input terminal incorporated therein is connected by an internal wiring inside the basic cell array. Therefore, the number of gates of the circuit construction can be reduced, and since the third signal input terminal is never connected to the wiring extended in the extension region, the wiring channel number is the same as when the 2-input NAND type cell is used. As a result, the increase of the chip area due to the increase of the channel number can be prevented.

As described above, one of the characterizing features of the present invention resides in that the reduction of the occupying area of one cell itself and the improvement in the cell utilization efficiency can be accomplished by a simple circuit construction.

The present invention has another feature.

As shown in FIGS. 7(a), 8 and 12(iv), the bipolar elements are disposed on both sides of MOSFET, so that the $V_{cc}$ line 13 and the GND line 14 are extended in parallel with the basic cell array. In other words, two NPN transistors $Q_1$ and $Q_2$ of a totem pole construction at the output stage in the basic cell are disposed on both sides of MOSFET, and along with this arrangement, the $V_{cc}$ line and the GND line extend above and below the cell. Then, it is possible to freely extend the first layer Al wiring in the same way in the center portion of the basic cell 10 in parallel with the basic cell array, that is, the region interposed between the $V_{cc}$ line 13 and the GND line 14, and the freedom of wiring is not at all limited by the existence of the $V_{cc}$ line 13 and the GND line 14. On the other hand, suppose that the $V_{cc}$ line 13 and the GND line 14 are extended at the center of the cell 10 as shown, for example, in FIG. 13. In that case, the wiring in the Y direction among the internal wirings of the basic cell array (I, I' . . . ) must step over the $V_{cc}$ line and the GND line, and hence a two-layered wiring must be employed. Therefore, the freedom of wiring drops and the wiring structure becomes extremely complicated. The present invention avoids this problem.

Even when the bipolar elements $Q_1$, $Q_2$ are disposed on both external sides (above and below the cell) of MOSFETs ($M_1 \sim M_6$) as in the present invention, the gate width W of the MOSFET ($M_1 \sim M_6$) is reduced by several dozens of $\mu$m in comparison with that of a pure CMOS cell, and this means that the bipolar elements $Q_1$, $Q_2$ are disposed afresh in this reduced region. Thus, the increase of the occupying area of the basic cell due to the disposition of the bipolar elements $Q_1$, $Q_2$ can be minimized.

Furthermore, since the widths $W_I$, $W_I'$ of the basic cell arays I, I' must be such that some dozens of aluminum first layer wirings 34 (e.g., 16, that is, 16 channels) in the X direction among the internal wirings of the basic cell arrays I, I' can be extended, the construction which permits disposing the bipolar elements in the Y direction provides the advantage that sufficient $W_I$, $W_I'$ can be secured, and it becomes possible to cope with the increase of channels of the internal wirings of the basic array due to the miniaturization of the cell. As described above, the present invention can provide an IC which requires less consumed power, operates at a high operating speed and has a high integration density.

The present invention can be applied suitably to ICs which have a plurality of cells and must utilize them efficiently, particularly to gate arrays.

We claim:

1. A semiconductor integrated circuit device comprising:
   (1) basic cells, each formed at predetermined area of semiconductor substrate, and each including a first and a second MOSFETs including a gate electrode and semiconductor regions serving as a pair of source and drain regions, respectively, and a pair of bipolar transistors;
   (2) basic cell arrays, each formed by disposing a plurality of said basic cells in a predetermined direction;
   (3) a basic cell matrix formed by disposing a plurality of said basic cell arrays in a direction substantially perpendicular to said predetermined direction and with predetermined gaps between them; and
   (4) a first operating potential line and a second operating potential line extending along said basic cell array substantially in parallel with said predetermined direction so as to pass opposite peripheries of each of said basic cells, and which are connected to selected ones of said bipolar transistors,
   wherein each of said bipolar transistors of said pair of bipolar transistors are respectively arranged at said opposite peripheries in said basic cell and said semiconductor regions serving as said pair of source and drain regions of said first and second MOSFETs are arranged substantially at a center portion of said basic cell, and wherein said gate electrode of said first MOSFET is extended so s to intersect said first and/or second operating potential lines and said gate electrode of said second MOSFET is extended between said pair of bipolar transistors so that both end portions of said gate electrode of said second MOSFET are arranged between said pair of bipolar transistors.

2. A semiconductor integrated circuit device according to claim 1, which further comprises:
   (5) first wirings extending in said basic cell array between said first and second operating potential lines, and second wirings extended in regions of said predetermined gaps between said basic cell arrays, said first and second wirings connecting selected ones of said MOSFETs and said bipolar transistor formed in said basic cells of said basic cell arrays to form a plurality of composite circuits comprising the combination of said MOSFETs and bipolar transistors.

3. A semiconductor integrated circuit device according to claim 2, wherein said first wirings are comprised of a conductive material of the same layer as said first and second operating potential lines.

4. A semiconductor integrated circuit device according to claim 2, wherein said second wirings are connected to end portions of said gate electrodes of selected ones of said first MOSFET.

5. A semiconductor integrated circuit device according to claim 1, wherein said gate electrodes of said first and second MOSFETs are made of a polycrystalline silicon film, respectively.

* * * * *